United States Patent
Ueno et al.

(10) Patent No.: US 10,937,657 B2
(45) Date of Patent: Mar. 2, 2021

(54) SEMICONDUCTOR DEVICE INCLUDING A REACTANT METAL LAYER DISPOSED BETWEEN AN ALUMINUM ALLOY FILM AND A CATALYST METAL FILM AND METHOD FOR MANUFACTURING THEREOF

(71) Applicant: Mitsubishi Electric Corporation, Tokyo (JP)

(72) Inventors: Ryuji Ueno, Tokyo (JP); Masatoshi Sunamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 14 days.

(21) Appl. No.: 16/323,464

(22) PCT Filed: Oct. 28, 2016

(86) PCT No.: PCT/JP2016/082000
§ 371 (c)(1),
(2) Date: Feb. 5, 2019

(87) PCT Pub. No.: WO2018/078784
PCT Pub. Date: May 3, 2018

(65) Prior Publication Data
US 2019/0244819 A1     Aug. 8, 2019

(51) Int. Cl.
*H01L 21/288* (2006.01)
*H01L 23/532* (2006.01)
(Continued)

(52) U.S. Cl.
CPC ........ *H01L 21/288* (2013.01); *C23C 18/1879* (2013.01); *C23C 18/32* (2013.01);
(Continued)

(58) Field of Classification Search
CPC . H01L 21/288; H01L 21/28; H01L 23/53219; H01L 23/53223; C23C 18/1879; C23C 18/32
(Continued)

(56) References Cited

U.S. PATENT DOCUMENTS 5,821,627 A * 10/1998 Mori ............... H05K 3/328
257/780
6,083,834 A *  7/2000 Chang ............. H01L 21/288
257/E21.174
(Continued)

FOREIGN PATENT DOCUMENTS

JP          5707709 B2     4/2015

OTHER PUBLICATIONS

International Search Report issued in PCT/JP2016/082000; dated Jan. 17, 2017.

*Primary Examiner* — Robert T Huber
(74) *Attorney, Agent, or Firm* — Studebaker & Brackett PC

(57) ABSTRACT

A technology capable of reducing contamination of a semiconductor substrate above which a nickel film is disposed is provided. A semiconductor device includes: a semiconductor substrate; an aluminum alloy film disposed on at least one of a front surface and a back surface of the semiconductor substrate; a catalyst metal film disposed above the aluminum alloy film and exhibiting catalytic activity for autocatalytic reaction that deposits nickel; an electroless nickel plating film disposed on the catalyst metal film; and a reactant layer disposed between the aluminum alloy film and the catalyst metal film and containing metal of the catalyst metal film.

12 Claims, 15 Drawing Sheets

(51) Int. Cl.
*H01L 21/28* (2006.01)
*C23C 18/18* (2006.01)
*C23C 18/32* (2006.01)
*C23C 18/42* (2006.01)
*H01L 21/02* (2006.01)

(52) U.S. Cl.
CPC ........ *C23C 18/42* (2013.01); *H01L 21/02068* (2013.01); *H01L 21/28* (2013.01); *H01L 23/53219* (2013.01); *H01L 23/53223* (2013.01)

(58) Field of Classification Search
USPC ......... 257/765; 438/614, 652, 678, 686, 688
See application file for complete search history.

(56) References Cited

U.S. PATENT DOCUMENTS

| | | | |
|---|---|---|---|
| 6,974,776 B2 * | 12/2005 | Dean | C23C 18/1651 |
| | | | 205/201 |
| 8,198,104 B2 | 6/2012 | Urano et al. | |
| 8,492,256 B2 * | 7/2013 | Urano | H01L 24/29 |
| | | | 438/584 |
| 2018/0138135 A1 * | 5/2018 | Sunamoto | C23C 18/1844 |

* cited by examiner

F I G. 7
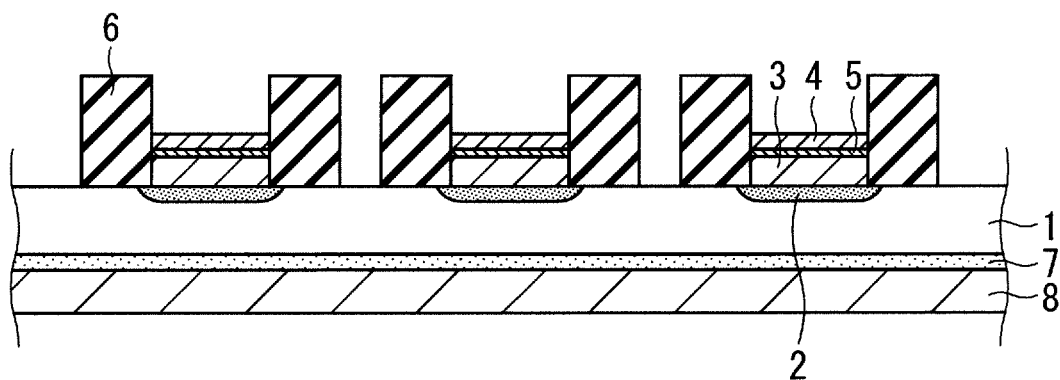
F I G 8
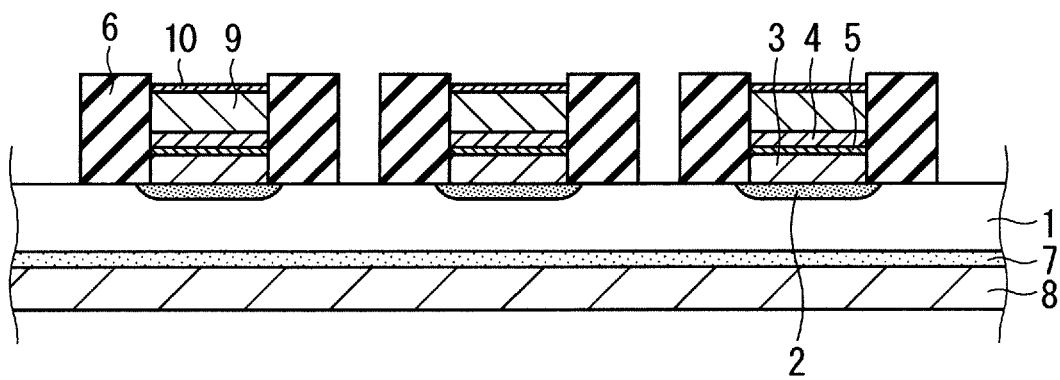

F I G. 9

| PROCESS | CONDITION |
|---|---|
| FRONT-SURFACE Al ALLOY FILM FORMATION (SPUTTERING) | POWER: 8kW, Ar: 20sccm, STAGE TEMPERATURE: 150°C |
| FRONT-SURFACE Au FILM FORMATION (SPUTTERING) | (1) POWER: 2kW, Ar: 20sccm, STAGE TEMPERATURE: 250°C ※ REACTANT LAYER FORMATION<br>(2) POWER: 2kW, Ar: 20sccm, STAGE TEMPERATURE: 25°C |
| OXYGEN PLASMA CLEANING | POWER: 200W, $O_2$: 100sccm, VACUUM DEGREE: 10Pa, TREATMENT TIME: 60 SECONDS |
| HYDROGEN PLASMA CLEANING | POWER: 500W, $H_2$: 70sccm, $O_2$: 30sccm, VACUUM DEGREE: 30Pa, TREATMENT TIME: 60 SECONDS |
| DEGREASING | ALKALINE DEGREASING SOLUTION, pH=9, 60°C, 3 MINUTES |
| ELECTROLESS Ni PLATING | ACIDIC ELECTROLESS Ni PLATING SOLUTION, pH=5.5, 80°C, 20 MINUTES |
| ELECTROLESS Au PLATING | NEUTRAL ELECTROLESS Au PLATING SOLUTION, pH=7.5, 75°C, 30 MINUTES |

| SAMPLE NO. | Au FILM TARGET THICKNESS (nm) | Al ALLOY FILM LOSS (nm) | ADHESION |
|---|---|---|---|
| 1 | 0 | 0 | × |
| 2 | 20 | 0 | △ |
| 3 | 50 | 0 | ○ |
| 4 | 100 | 0 | ○ |
| 5 | 150 | 0 | ○ |
| 6 | 200 | 0 | ○ |

F I G. 1 7
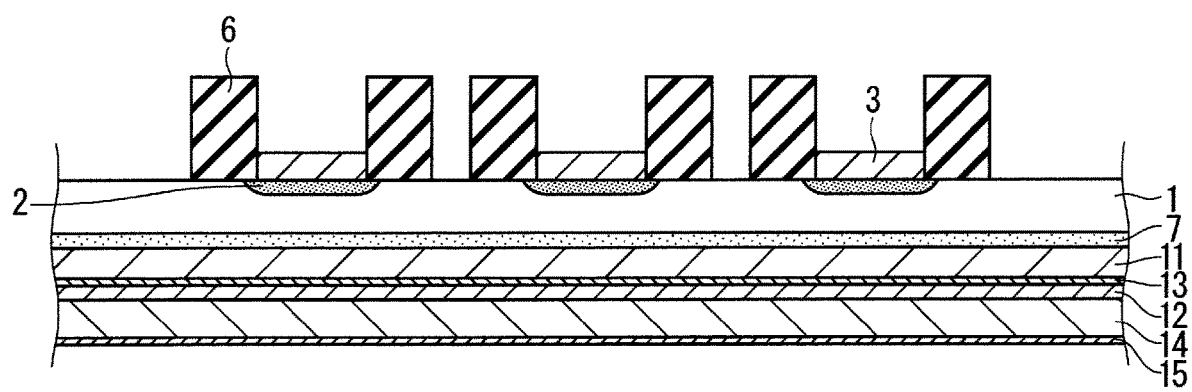

FIG. 18

| PROCESS | CONDITION |
|---|---|
| BACK-SURFACE Al ALLOY FILM FORMATION (SPUTTERING) | POWER: 8kW, Ar: 20sccm, STAGE TEMPERATURE: 150°C |
| BACK-SURFACE Au FILM FORMATION (SPUTTERING) | (1) POWER: 2kW, Ar: 20sccm, STAGE TEMPERATURE: 250°C ※ REACTANT LAYER FORMATION<br>(2) POWER: 2kW, Ar: 20sccm, STAGE TEMPERATURE: 25°C |
| OXYGEN PLASMA CLEANING | POWER: 200W, $O_2$: 100sccm, VACUUM DEGREE: 10Pa, TREATMENT TIME: 60 SECONDS |
| HYDROGEN PLASMA CLEANING | POWER: 500W, $H_2$: 70sccm, $O_2$: 30sccm, VACUUM DEGREE: 30Pa, TREATMENT TIME: 60 SECONDS |
| DEGREASING | ALKALINE DEGREASING SOLUTION, pH=9, 60°C, 3 MINUTES |
| ELECTROLESS Ni PLATING | ACIDIC ELECTROLESS Ni PLATING SOLUTION, pH=5.5, 80°C, 20 MINUTES |
| ELECTROLESS Au PLATING | NEUTRAL ELECTROLESS Au PLATING SOLUTION, pH=7.5, 75°C, 30 MINUTES |

F I G. 1 9
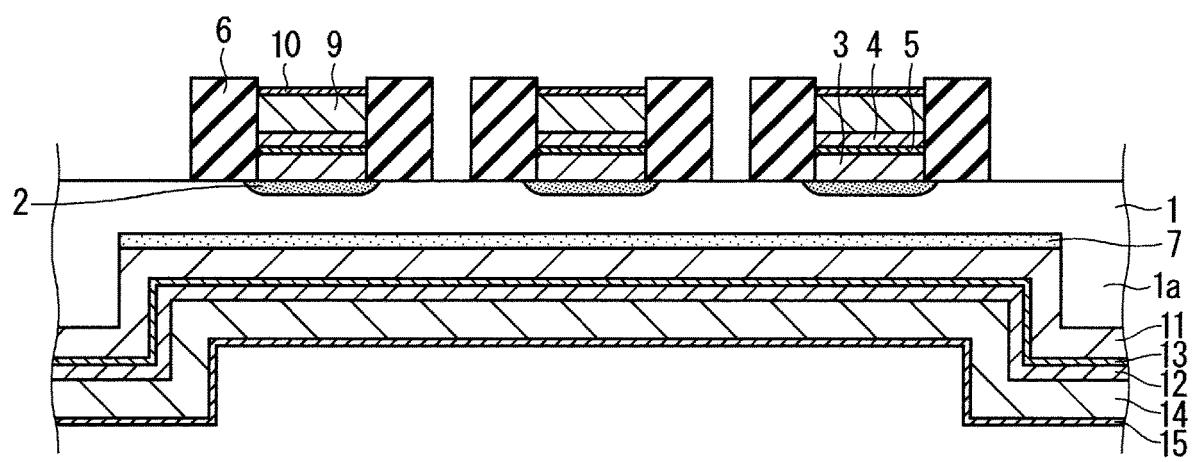

F I G. 2 4
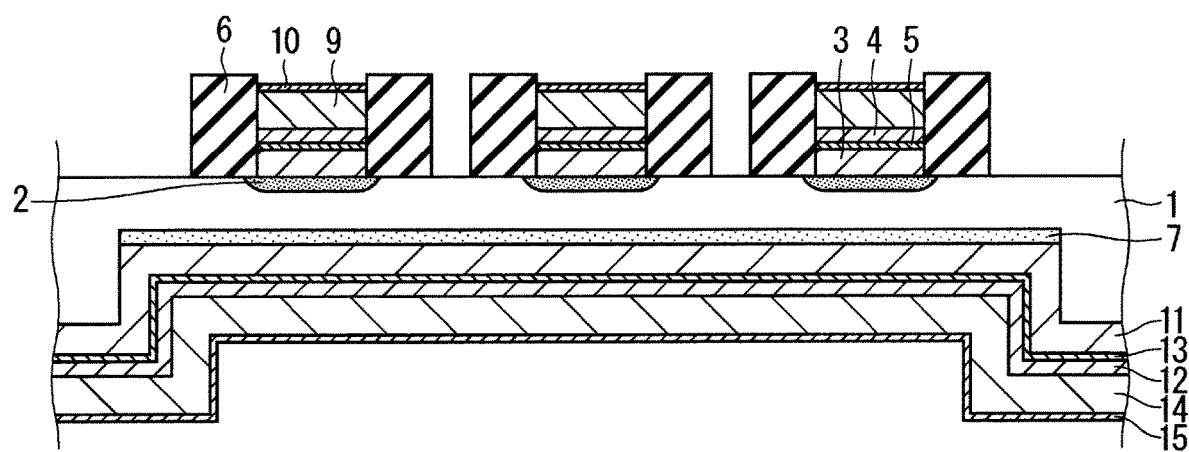

F I G. 25

| PROCESS | CONDITION |
|---|---|
| FRONT-SURFACE Al ALLOY FILM FORMATION (SPUTTERING) | POWER: 8kW, Ar: 20sccm, STAGE TEMPERATURE: 150°C |
| FRONT-SURFACE Au FILM FORMATION (SPUTTERING) | (1) POWER: 2kW, Ar: 20sccm, STAGE TEMPERATURE: 250°C ※ REACTANT LAYER FORMATION<br>(2) POWER: 2kW, Ar: 20sccm, STAGE TEMPERATURE: 25°C |
| BACK-SURFACE Al ALLOY FILM FORMATION (SPUTTERING) | POWER: 8kW, Ar: 20sccm, STAGE TEMPERATURE: 150°C |
| BACK-SURFACE Au FILM FORMATION (SPUTTERING) | (1) POWER: 2kW, Ar: 20sccm, STAGE TEMPERATURE: 250°C ※ REACTANT LAYER FORMATION<br>(2) POWER: 2kW, Ar: 20sccm, STAGE TEMPERATURE: 25°C |
| OXYGEN PLASMA CLEANING | POWER: 200W, O2: 100sccm, VACUUM DEGREE: 10Pa, TREATMENT TIME: 60 SECONDS |
| HYDROGEN PLASMA CLEANING | POWER: 500W, H2: 70sccm, O2: 30sccm, VACUUM DEGREE: 30Pa, TREATMENT TIME: 60 SECONDS |
| DEGREASING | ALKALINE DEGREASING SOLUTION, pH=9, 60°C, 3 MINUTES |
| ELECTROLESS Ni PLATING | ACIDIC ELECTROLESS Ni PLATING SOLUTION, PH=5.5, 80°C, 20 MINUTES |
| ELECTROLESS Au PLATING | NEUTRAL ELECTROLESS Au PLATING SOLUTION, PH=7.5, 75°C, 30 MINUTES | ure of a semiconductor device according to a first embodiment.

SEMICONDUCTOR DEVICE INCLUDING A REACTANT METAL LAYER DISPOSED BETWEEN AN ALUMINUM ALLOY FILM AND A CATALYST METAL FILM AND METHOD FOR MANUFACTURING THEREOF

TECHNICAL FIELD

The present invention relates to a semiconductor device including a nickel film, and a method for manufacturing the same.

BACKGROUND ART

In the process of manufacturing a vertically conductive semiconductor device such as an insulated gate bipolar transistor (IGBT) or a diode, a semiconductor wafer is fabricated to be thin to reduce resistance at conduction and improve the current-voltage characteristic. Some recent semiconductor wafers are thinned to have a thickness of 50 µm approximately.

In the mainstream conventional technology of mounting such a vertically conductive semiconductor device onto a circuit board, solder bonding is performed on a back-surface electrode of the semiconductor device to achieve wire bonding for connecting, for example, an aluminum wire to the front-surface electrode. However, recently, the technology of solder bonding on both surfaces of a front-surface electrode and a back-surface electrode of the semiconductor device has been used to reduce cost and improve heat dissipation. For this reason, a nickel (Ni)/gold (Au) film, which is excellent in solder bonding, is required for the front-surface electrode of the semiconductor device. However, the Ni film decreases through erosion by solder at solder bonding, and thus the Ni film needs to have a relatively large thickness of, for example, 2 µm or larger. Manufacturing cost is high and patterning is difficult when such a relatively thick Ni film is formed by evaporation coating or sputtering deposition. Thus, the formation by plating, with which the cost is low and patterning is easy, has been increasingly popular.

However, the warping of the semiconductor device, that is, the warping of the semiconductor wafer increases with the thinning of the semiconductor device and the thickening of the Ni film as a front-surface electrode. As a result, handling of the semiconductor device becomes difficult, and solder is likely to contain voids at mounting on a circuit board and the voids cause bonding defects, which has resulted in decrease of the yield.

Typically, an electroless Ni plating method called zincate treatment is used as Ni plating on an aluminum (Al) alloy electrode surface of a semiconductor device. In the zincate treatment, first, an Al alloy electrode formed on a semiconductor wafer is degreased and pickled to have an active surface. Thereafter, a thin Zn film is deposited on the Al alloy electrode surface by utilizing the standard oxidation-reduction potential of zinc (Zn), which is higher than that of Al, and then an upper part of the Zn film is replaced with an Ni film to form electroless Ni plating.

However, the above-described zincate treatment has such a problem that the Al alloy electrode is locally anomalously etched by chemical solution of degreasing, pickling, and zincate treatment, and disappears. This disappearance occurs due to anomaly of the film quality of the Al alloy electrode and foreign matter in the film. When the Al alloy electrode disappears in this manner, the underlying semiconductor substrate is contaminated through exposure to the chemical solution, and the electric property thereof degrades. To prevent such a problem, various technologies have been disclosed (for example, Patent Document 1).

PRIOR ART DOCUMENT

Patent Document

Patent Document 1: Japanese Patent No. 5707709

SUMMARY

Problem to be Solved by the Invention

In a technology disclosed in Patent Document 1, the process of activating a metal electrode surface below an Ni plating film is performed to deposit an electroless Ni plating film on the metal electrode surface without performing pretreatment such as degreasing, pickling, and zincate treatment in an Ni plating process. However, with this technology, it is difficult to maintain a stable quality in the process of activating the metal electrode surface, which results in defect of adhesion between the metal electrode film and the Ni plating film, and deposition anomaly of the Ni plating film.

The present invention is intended to solve the above-described problem and provide a technology capable of reducing contamination of a semiconductor substrate above which a nickel film is disposed.

Means to Solve the Problem

A semiconductor device according to the present invention includes: a semiconductor substrate; an aluminum alloy film disposed on at least one of a front surface and a back surface of the semiconductor substrate; a catalyst metal film disposed above the aluminum alloy film and exhibiting catalytic activity for autocatalytic reaction that deposits nickel; an electroless nickel plating film disposed on the catalyst metal film; and a reactant layer disposed between the aluminum alloy film and the catalyst metal film and containing metal of the catalyst metal film.

Effects of the Invention

According to the present invention, a reactant layer is disposed between an aluminum alloy film and a catalyst metal film and contains metal of the catalyst metal film. Accordingly, the reactant layer reduces contamination of a semiconductor substrate with, for example, a degreasing solution, an electroless Ni plating solution, and an electroless Au plating solution in plating treatment.

These and other objects, features, aspects and advantages of the present invention will become more apparent from the following detailed description of the present invention when taken in conjunction with the accompanying drawings.

BRIEF DESCRIPTION OF DRAWINGS

FIG. 7 is a cross-sectional view illustrating the process of manufacturing the semiconductor device according to the first embodiment.

FIG. 8 is a cross-sectional view illustrating the process of manufacturing the semiconductor device according to the first embodiment.

FIG. 9 is a diagram illustrating exemplary conditions of the process of manufacturing the semiconductor device according to the first embodiment.

FIG. 17 is a cross-sectional view illustrating the process of manufacturing the semiconductor device according to the second embodiment.

FIG. 18 is a diagram illustrating exemplary conditions of the process of manufacturing the semiconductor device according to the second embodiment.

FIG. 19 is a cross-sectional view illustrating a configuration of a semiconductor device according to a third embodiment.

FIG. 24 is a cross-sectional view illustrating the process of manufacturing the semiconductor device according to the third embodiment.

FIG. 25 is a diagram illustrating exemplary conditions of the process of manufacturing the semiconductor device according to the third embodiment.

DESCRIPTION OF EMBODIMENTS

First Embodiment

Figure 1:
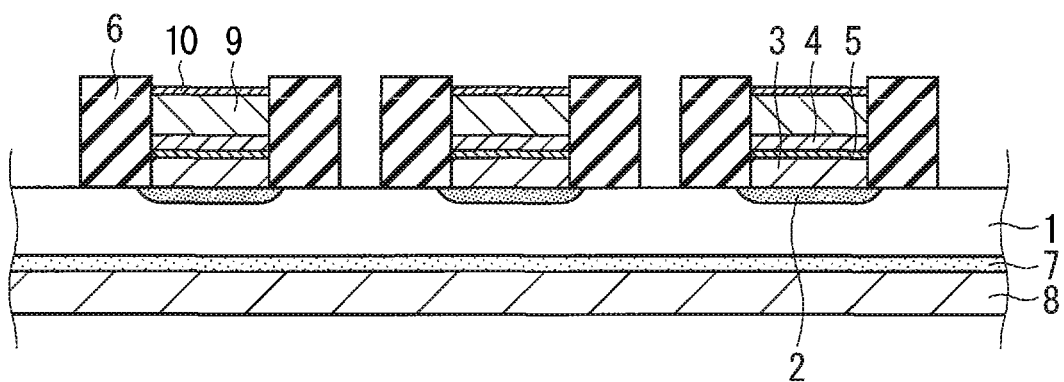
FIG. 1 is a cross-sectional view illustrating a configuration of a semiconductor device according to a first embodiment.

FIG. 1 is a cross-sectional view illustrating a configuration of a semiconductor device according to a first embodiment of the present invention. The semiconductor device illustrated in FIG. 1 includes a semiconductor wafer 1, a front-surface semiconductor element region 2, a front-surface Al alloy film 3, a front-surface Au film 4, a front-surface reactant layer 5, a polyimide protective film 6, a back-surface diffusion region 7, a back-surface electrode 8, a front-surface electroless Ni plating film 9, and a front-surface electroless Au plating film 10 as an electroless gold plating film. The front-surface Al alloy film 3, the front-surface Au film 4, the front-surface reactant layer 5, the front-surface electroless Ni plating film 9, and the front-surface electroless Au plating film 10 are used as electrodes on the front side of the semiconductor wafer 1.

The semiconductor wafer 1 as a semiconductor substrate is made of, for example, silicon (Si) or a wide-bandgap semiconductor such as silicon carbide (SiC). The front-surface semiconductor element region 2 is disposed on the front surface of the semiconductor wafer 1, and has, for example, an appropriately changed impurity concentration. The front-surface Al alloy film 3 as an aluminum alloy film is disposed in, for example, the front-surface semiconductor element region 2 on the front surface of the semiconductor wafer 1.

The front-surface Au film 4 as a catalyst metal film is a film or layer exhibiting catalytic activity for autocatalytic reaction that deposits nickel and disposed above the front-surface Al alloy film 3. The front-surface electroless Ni plating film 9 as an electroless nickel plating film is disposed on the front-surface Au film 4. The front-surface reactant layer 5 is a film containing Au as the metal of the front-surface Au film 4 and disposed between the front-surface Al alloy film 3 and the front-surface Au film 4.

With this configuration, the front-surface reactant layer 5 disposed between the front-surface Al alloy film 3 and the front-surface Au film 4 functions as a barrier film to prevent contamination of the front-surface semiconductor element region 2 as a result of etching of the front-surface Al alloy film 3 by treatment liquid at plating. The front-surface Au film 4 exhibiting autodeposition catalytic activity for nickel is disposed on the surface of the front-surface reactant layer 5, and the front-surface electroless Ni plating film 9 deposited through autocatalytic reaction of nickel is disposed on the surface of the front-surface Au film 4.

<Manufacturing Method>

Figure 2:
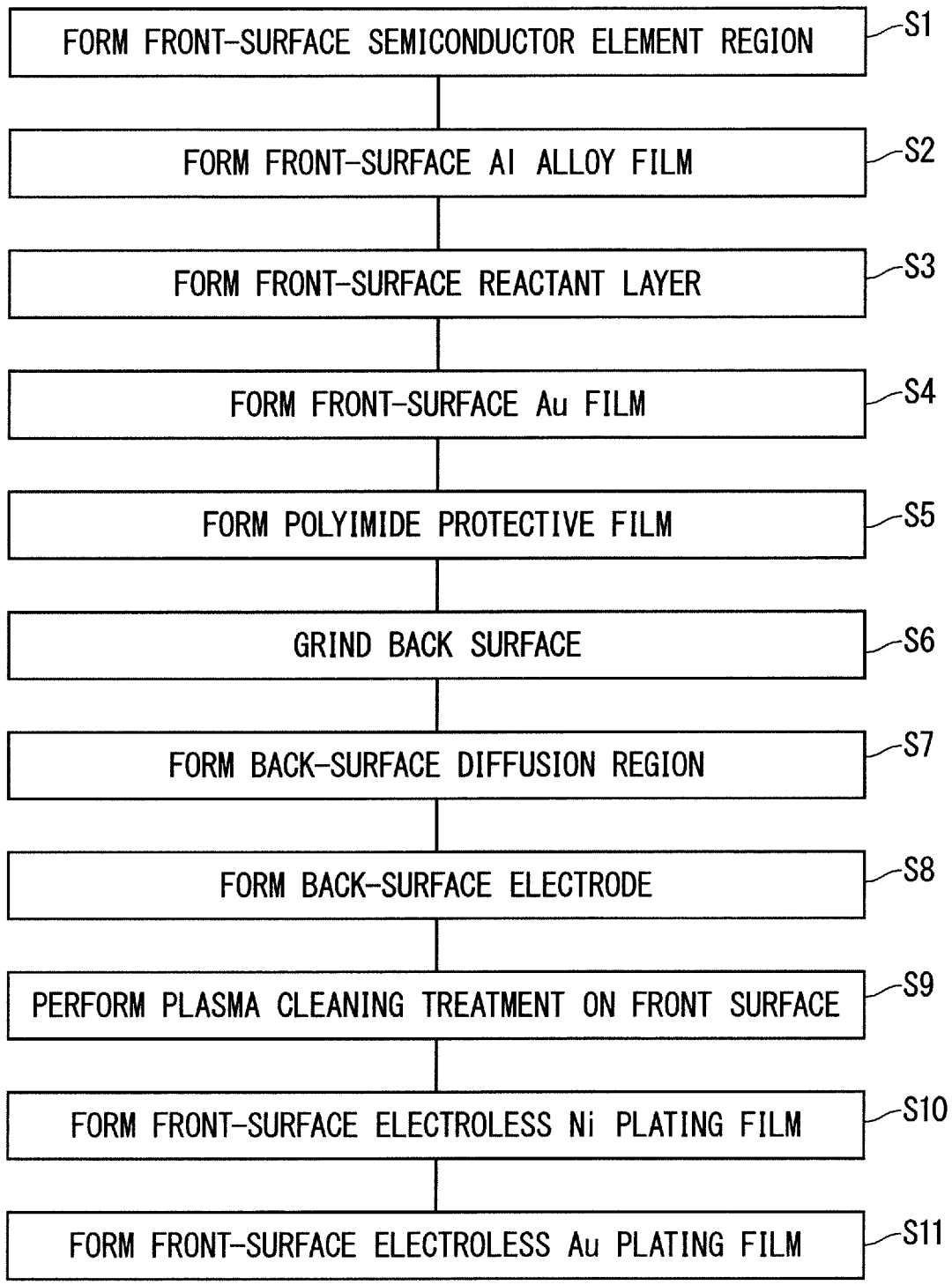
FIG. 2 is a flowchart illustrating a process of manufacturing the semiconductor device according to the first embodiment.

FIG. 2 is a flowchart illustrating a process of manufacturing the semiconductor device according to the first embodiment.

Figure 3:
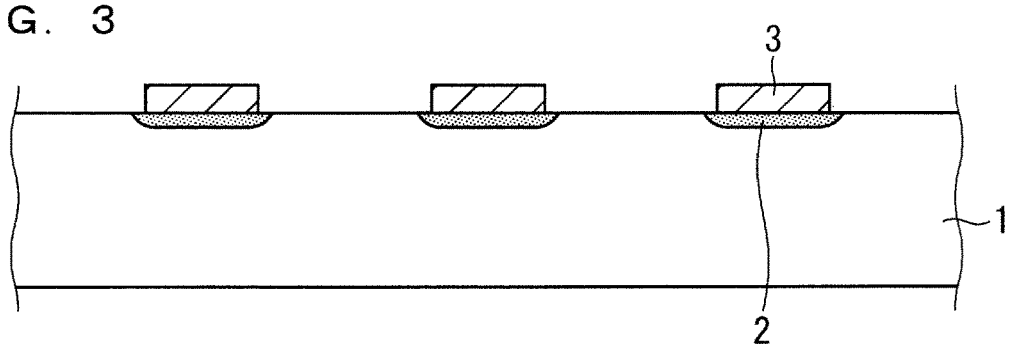
FIG. 3 is a cross-sectional view illustrating the process of manufacturing the semiconductor device according to the first embodiment.

As illustrated in FIG. 3, at step S1, the front-surface semiconductor element region 2 is formed on the front surface of the semiconductor wafer 1. At step S2, the front-surface Al alloy film 3 containing, for example, AlSi, AlCu (Cu is copper), or AlSiCu is formed in a desired region on the front surface of the semiconductor wafer 1 by sputtering.

Figure 4:
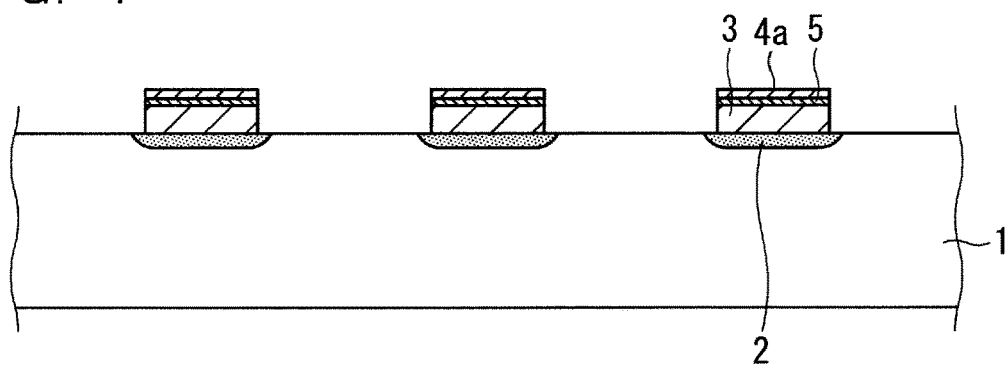
FIG. 4 is a cross-sectional view illustrating the process of manufacturing the semiconductor device according to the first embodiment.

Subsequently at step S3, as illustrated in FIG. 4, a front-surface Au film 4a is formed on the surface of the front-surface Al alloy film 3 by sputtering. In this process, a wafer stage in a deposition chamber is heated to deposit the front-surface Au film 4a. When the front-surface Au film 4a is deposited by heating in this manner, Au of the front-surface Au film 4a diffuses in a part of the front-surface Al alloy film 3 in contact with the front-surface Au film 4a. As a result, the front-surface reactant layer 5 containing Au is formed between the front-surface Al alloy film 3 and the front-surface Au film 4a.

Figure 5:
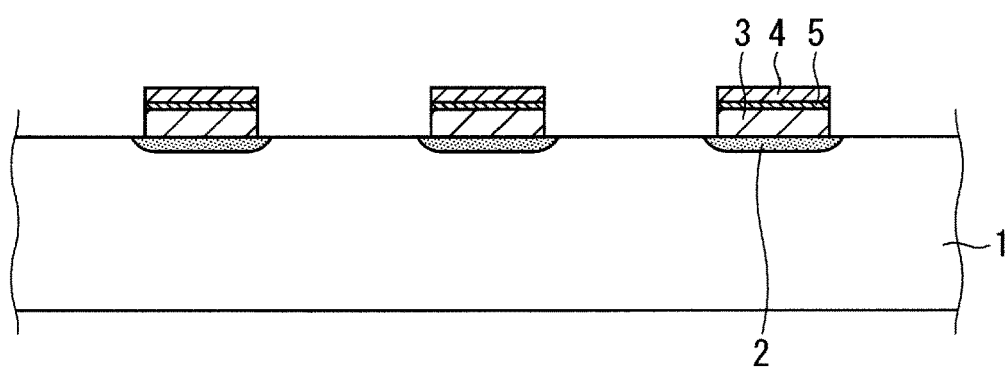
FIG. 5 is a cross-sectional view illustrating the process of manufacturing the semiconductor device according to the first embodiment.

As illustrated in FIG. 5, at step S4, the temperature of the wafer stage in the deposition chamber is set to be equal to or lower than room temperature, for example, 25° C., and the deposition of the front-surface Au film is continued to complete the front-surface Au film 4. Au diffusion from the front-surface Au film to the front-surface reactant layer 5 during deposition of the front-surface Au film can be reduced by performing the deposition with the wafer stage at 25° C. or lower.

Figure 6:
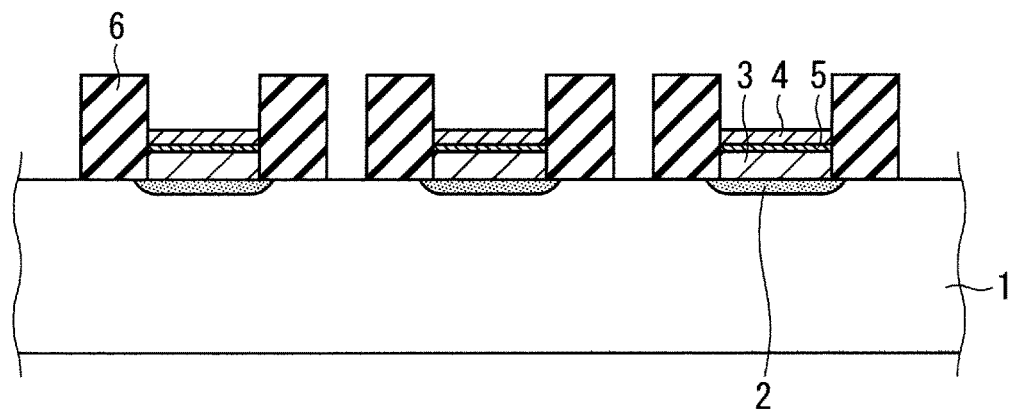
FIG. 6 is a cross-sectional view illustrating the process of manufacturing the semiconductor device according to the first embodiment.

Subsequently at step S5, as illustrated in FIG. 6, the polyimide protective film 6 made of polyimide is formed to cover the edge of the front-surface Au film 4.

Subsequently at step S6, as illustrated in FIG. 7, the semiconductor wafer 1 is thinned by mechanically grinding the back surface of the semiconductor wafer 1. Thereafter, wet etching is performed to remove, by 5 to 20 μm, a defect layer (not illustrated) generated on the semiconductor wafer 1 through the mechanical grinding, thereby thinning the semiconductor wafer 1 to a desired thickness. Subsequently at step S7, the back-surface diffusion region 7 is formed on the back surface of the semiconductor wafer 1, and then at step S8, the back-surface electrode 8 is formed on the back-surface diffusion region 7. The back-surface electrode 8 is, for example, a plurality of metal films including a film of an Al alloy such as AlSi, AlCu, or AlSiCu, a Ti film, an Ni film, and an Au film sequentially formed on the back surface of the semiconductor wafer 1 by sputtering. With this configuration, the Al alloy film provides favorable bonding between the semiconductor wafer 1 and the back-surface electrode 8, the Ti film provides a barrier metal function, and the Ni film and the Au film provide a favorable solder bonding.

Subsequently at step S9, cleaning treatment by plasma, in other words, plasma cleaning is performed on the surface of the front-surface Au film 4. In the first embodiment, the plasma cleaning involves cleaning by oxygen plasma and then cleaning by hydrogen plasma.

The oxygen plasma cleaning treatment is a process of removing, through oxidation decomposition with oxygen plasma, a firm residual organic substance that is adhered to the surface of the front-surface Au film 4 and cannot be removed by plating pretreatment. The hydrogen plasma cleaning treatment is a process of removing the residual organic substance through collision with argon ions or nitrogen ions in argon or nitrogen plasma mixed with hydrogen, and simultaneously removing, through reduction with hydrogen ions, oxide adhered to the surface of the front-surface Au film 4. The surface of the front-surface Au film 4 can be cleaned by performing the oxygen plasma cleaning treatment and the hydrogen plasma cleaning treatment, which enhances adhesion between the front-surface Au film 4 and the front-surface electroless Ni plating film 9, which is formed through the next process.

Subsequently at step S10, as illustrated in FIG. 8, the front-surface electroless Ni plating film 9 is formed on the front-surface Au film 4. First, the semiconductor wafer 1 is immersed in a degreasing solution to remove grease and organic substance on the surface of the front-surface Au film 4, thereby improving the wettability of the front-surface Au film 4. Subsequently, the semiconductor wafer 1 is immersed in an electroless Ni plating solution to form, through autocatalytic reaction that deposits nickel, the front-surface electroless Ni plating film 9 having a desired thickness on the front-surface Au film 4. The deposition of electroless Ni plate through the autocatalytic reaction occurs because Au of the front-surface Au film 4 serves as a catalyst point of electroless Ni plate deposition.

Specifically, first, Au of the front-surface Au film 4 functions as a catalyst, and electrons are discharged from a reducing agent in the electroless Ni plating solution. Subsequently, nickel ions in the electroless Ni plating solution receive the electrons, and accordingly, electroless Ni plate is deposited on the surface of the front-surface Au film 4. Thereafter, Ni of the electroless Ni plating film is used as a catalyst in place of Au of the front-surface Au film 4 in the above-described reaction to cause nickel autocatalytic reaction in which nickel serves a catalyst in nickel deposition. Such autocatalytic reaction does not require zincate treatment, which is conventionally used for electroless Ni plate deposition on the surface of an Al alloy. Thus, according to the method for manufacturing the semiconductor device according to the first embodiment, loss of the Al alloy film through the zincate treatment can be reduced, and as a result, contamination of the semiconductor wafer 1 can be reduced.

The thickness of the front-surface electroless Ni plating film 9 is preferably, for example, 2 to 10 μm, and more preferably, for example, 5 μm, with a film stress on the semiconductor wafer 1 and the like taken into account. With the plating method, it is possible to easily form such a thick film having a thickness of several micrometers, and form an electroless Ni plating film having a desired pattern because electroless Ni plating does not deposit on a protective film made of, for example, polyimide in which no communication of electrons occurs.

Subsequently at step S11, the semiconductor wafer 1 after the formation of the front-surface electroless Ni plating film 9 is immersed in an electroless Au plating solution to reduce oxidation of the surface of the front-surface electroless Ni plating film 9. Accordingly, the front-surface electroless Au plating film 10 having a thickness of, for example, 10 to 70 nm is formed on the front-surface electroless Ni plating film 9. In this example, the formation of the front-surface electroless Au plating film 10 is achieved by using the nickel autocatalytic reaction, but the present invention is not limited thereto. For example, the zincate treatment may be used.

FIG. 9 is a diagram illustrating exemplary conditions of the above-described processes. It was observed that, when a semiconductor device was formed under the conditions illustrated in FIG. 9, the front-surface reactant layer 5 having a thickness of 67 nm was disposed between the front-surface Al alloy film 3 and the front-surface Au film 4. Moreover, no loss occurred to the front-surface Al alloy film 3, and sufficient sticking force was maintained between the front-surface Al alloy film 3 and the front-surface electroless Ni plating film 9.

<Gist of First Embodiment>

The semiconductor device according to the first embodiment as described above includes the front-surface reactant layer 5 disposed between the front-surface Al alloy film 3 and the front-surface Au film 4. With this configuration, the front-surface reactant layer 5 functions as a barrier film to reduce contamination of the semiconductor wafer 1 by the degreasing solution, the electroless Ni plating solution, and the electroless Au plating solution at plating treatment. In addition, loss of the front-surface Al alloy film 3 due to the degreasing solution is reduced, which leads to formation of the front-surface electroless Ni plating film 9 having a uniform film thickness.

The semiconductor device according to the first embodiment includes the front-surface electroless Au plating film 10 on the front-surface electroless Ni plating film 9. This configuration reduces oxidation of the surface of the front-surface electroless Ni plating film 9, thereby achieving favorable solder bonding.

In addition, according to the first embodiment, the front-surface Au film 4 made of Au, which exhibits high catalytic activity in the electroless Ni plating formation, is used as a catalyst metal film. With this configuration, the front-surface electroless Ni plating film 9 is efficiently deposited, which leads to a reduced production cost. In the above description, Au is used as the catalyst metal of the catalyst metal film. However, the catalyst metal is not limited thereto. For example, Pd (palladium), Ni, and Co (cobalt), which have the catalysis of electroless Ni plate, may be used to achieve the above-described effects.

In the first embodiment, the front-surface Au film 4 is cleaned by plasma. With this configuration, the surface of the front-surface Au film 4 becomes active, which enhances adhesion between the front-surface Au film 4 and the front-surface electroless Ni plating film 9.

<Modification>

Figures 10, 11:
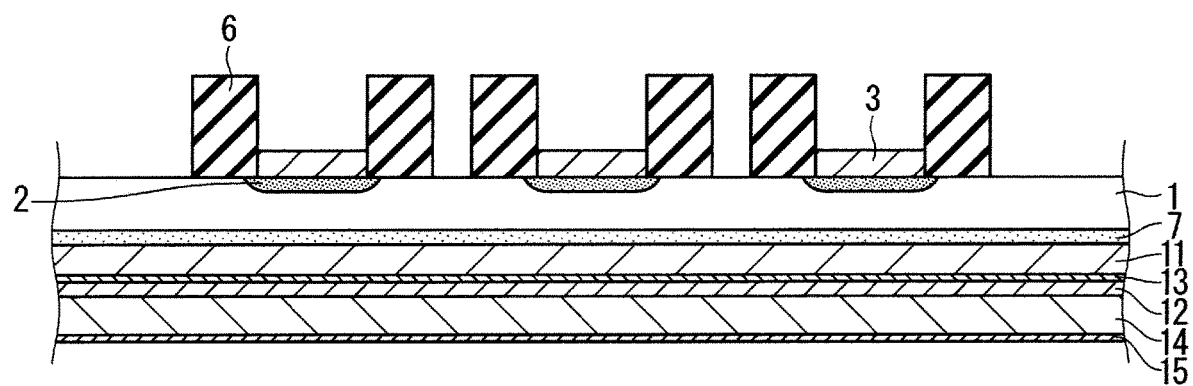
FIG. 10 is a diagram illustrating the relation between the thickness of a front-surface Au film and various characteristics of a semiconductor device according to a modification.
FIG. 11 is a cross-sectional view illustrating a configuration of a semiconductor device according to a second embodiment.

FIG. 10 is a diagram illustrating the relation among the thickness of the front-surface Au film 4, the amount of loss of the front-surface Al alloy film 3, and the adhesion between the front-surface Au film 4 and the front-surface electroless Ni plating film 9, which are described in the first embodiment. In the result illustrated in FIG. 10, no loss of the front-surface Al alloy film 3 occurs under any condition, which indicates the effect of the front-surface reactant layer 5 as a barrier film. The adhesion improves as a target thickness of the front-surface Au film 4 increases. Thus, the thickness of the front-surface Au film 4 is preferably 20 nm to 200 nm inclusive, more preferably 50 nm to 200 nm inclusive. This configuration increases the adhesion between the front-surface Au film 4 and the front-surface electroless Ni plating film 9. The above-described modification is also applicable to a catalyst metal film in a second embodiment or later to be described below.

Second Embodiment

FIG. 11 is a cross-sectional view illustrating a configuration of a semiconductor device according to the second embodiment of the present invention. Hereinafter, among components described in the second embodiment, a component same as or similar to that in the first embodiment is denoted by the same reference sign, and any different component will be mainly described.

The semiconductor device illustrated in FIG. 11 includes the semiconductor wafer 1, the front-surface semiconductor element region 2, the front-surface Al alloy film 3, the polyimide protective film 6, the back-surface diffusion region 7, a back-surface Al alloy film 11, a back-surface Au film 12, a back-surface reactant layer 13, a back-surface electroless Ni plating film 14, and a back-surface electroless Au plating film 15.

In the second embodiment, the back-surface Al alloy film 11, the back-surface Au film 12, the back-surface reactant layer 13, the back-surface electroless Ni plating film 14, and the back-surface electroless Au plating film 15 are disposed on the back surface side of the semiconductor wafer 1, as components same as the front-surface Al alloy film 3, the front-surface Au film 4, the front-surface reactant layer 5, the front-surface electroless Ni plating film 9, and the front-surface electroless Au plating film 10, respectively, which are disposed on the front surface side of the semiconductor wafer 1 illustrated in FIG. 1.

<Manufacturing Method>

Figure 12:
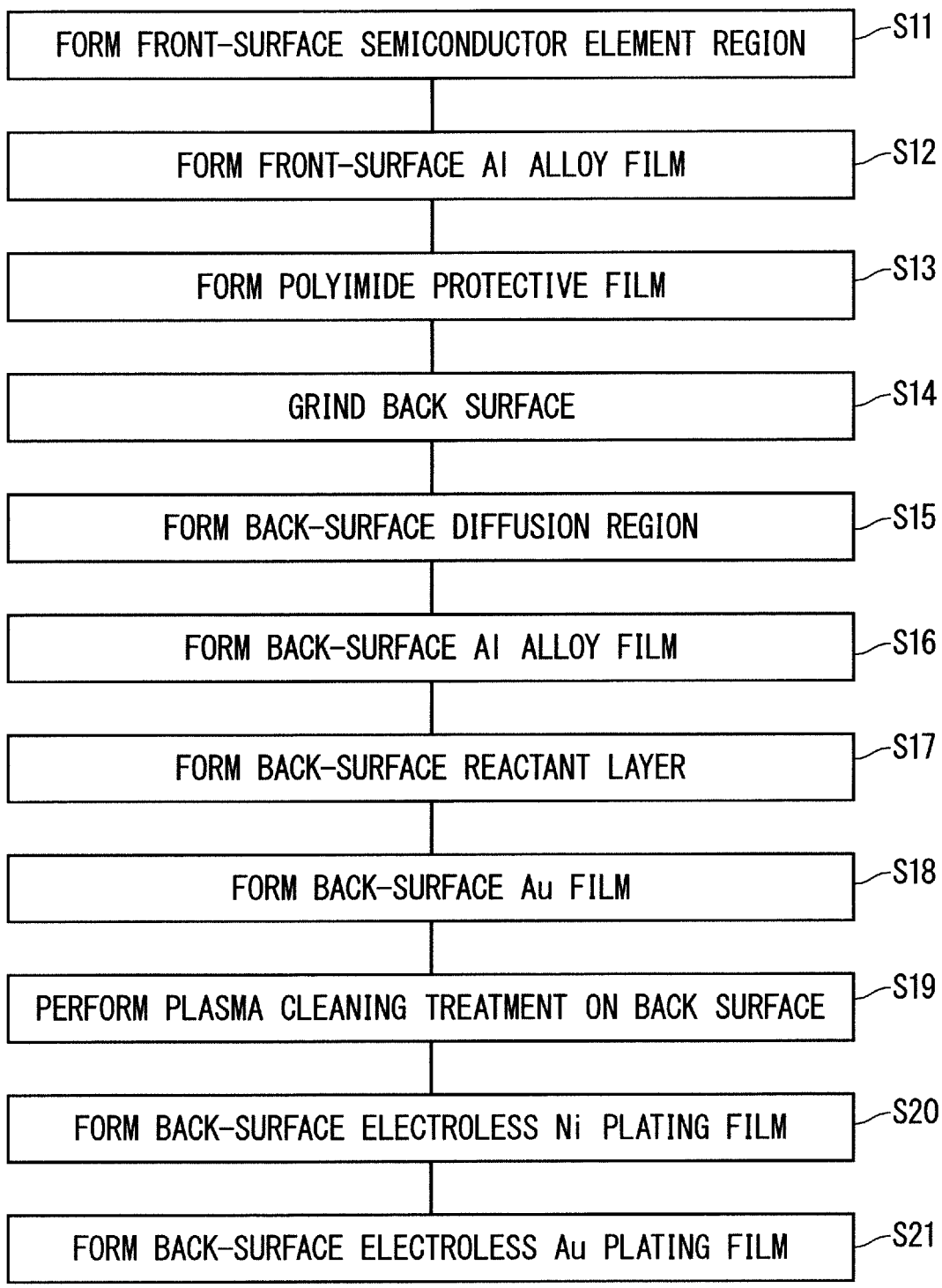
FIG. 12 is a flowchart illustrating a process of manufacturing the semiconductor device according to the second embodiment.

FIG. 12 is a flowchart illustrating a process of manufacturing the semiconductor device according to the second embodiment.

Figure 13:
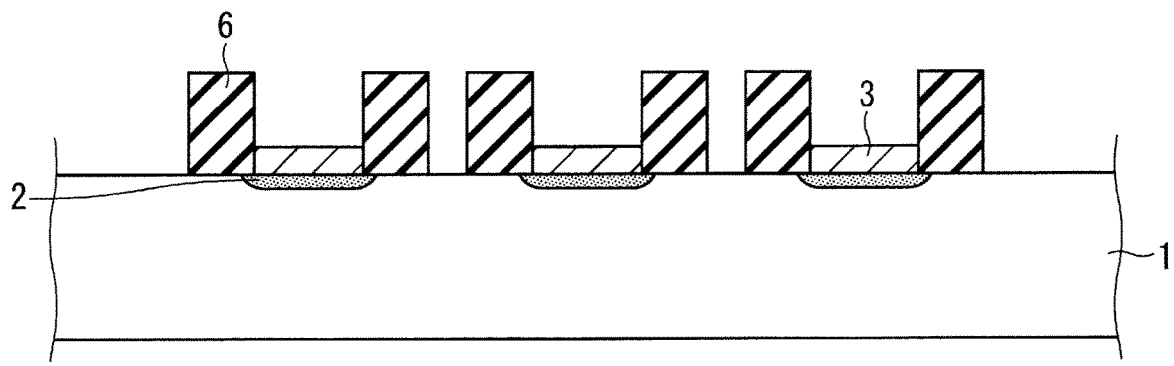
FIG. 13 is a cross-sectional view illustrating the process of manufacturing the semiconductor device according to the second embodiment.

As illustrated in FIG. 13, at step S11, the front-surface semiconductor element region 2 is formed on the front surface of the semiconductor wafer 1. At step S12, the front-surface Al alloy film 3 containing, for example, AlSi, AlCu, or AlSiCu is formed in a desired region on the front surface of the semiconductor wafer 1 by sputtering. Subsequently at step S13, the polyimide protective film 6 made of polyimide is formed to cover the edge of the front-surface Al alloy film 3.

Figure 14:
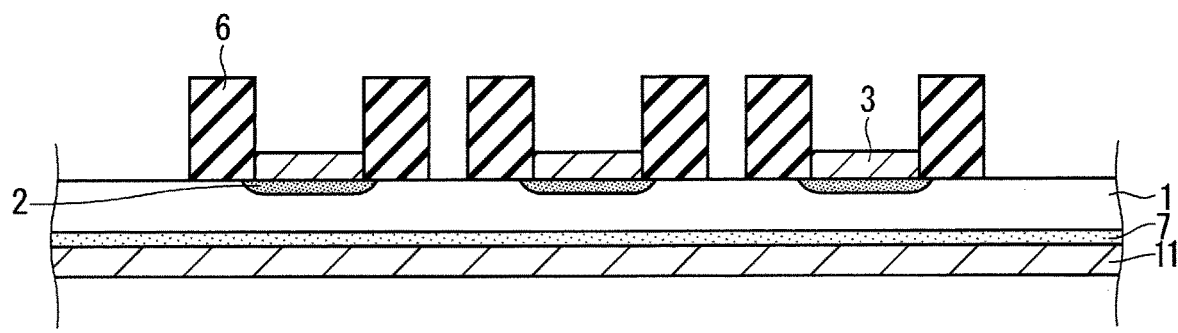
FIG. 14 is a cross-sectional view illustrating the process of manufacturing the semiconductor device according to the second embodiment.

Subsequently at step S14, as illustrated in FIG. 14, the semiconductor wafer 1 is thinned by mechanically grinding the back surface of the semiconductor wafer 1. Thereafter, wet etching is performed to remove, by 5 to 20 μm, a defect layer (not illustrated) generated on the semiconductor wafer 1 through the mechanical grinding, thereby thinning the semiconductor wafer 1 to a desired thickness. Subsequently at step S15, the back-surface diffusion region 7 is formed on the back surface of the semiconductor wafer 1, and then at step S16, the back-surface Al alloy film 11 containing, for example, AlSi, AlCu, or AlSiCu is formed on the back surface of the semiconductor wafer 1 by sputtering.

Figure 15:
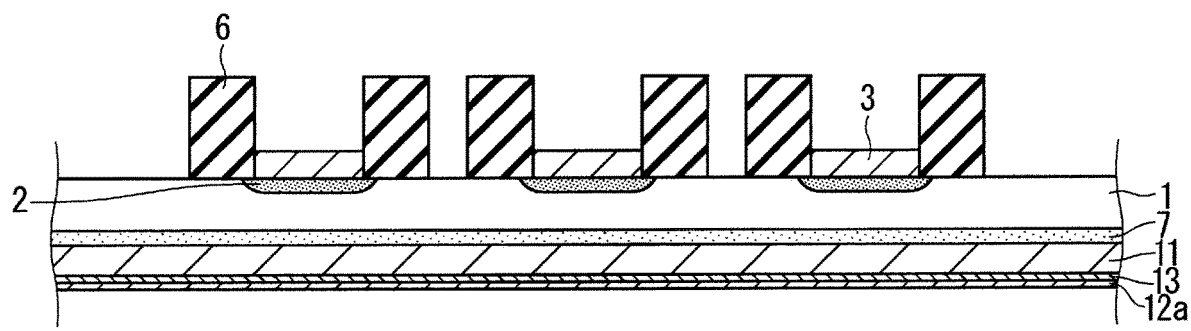
FIG. 15 is a cross-sectional view illustrating the process of manufacturing the semiconductor device according to the second embodiment.

Subsequently at step S17, as illustrated in FIG. 15, a back-surface Au film 12a is formed on the surface of the back-surface Al alloy film 11 by sputtering. In this process, the wafer stage in the deposition chamber is heated to deposit the back-surface Au film 12a. When the back-surface Au film 12a is deposited by heating in this manner, Au of the back-surface Au film 12a diffuses in a part of the back-surface Al alloy film 11 in contact with the back-surface Au film 12a. As a result, the back-surface reactant layer 13 containing Au is formed between the back-surface Al alloy film 11 and the back-surface Au film 12a.

Figure 16:
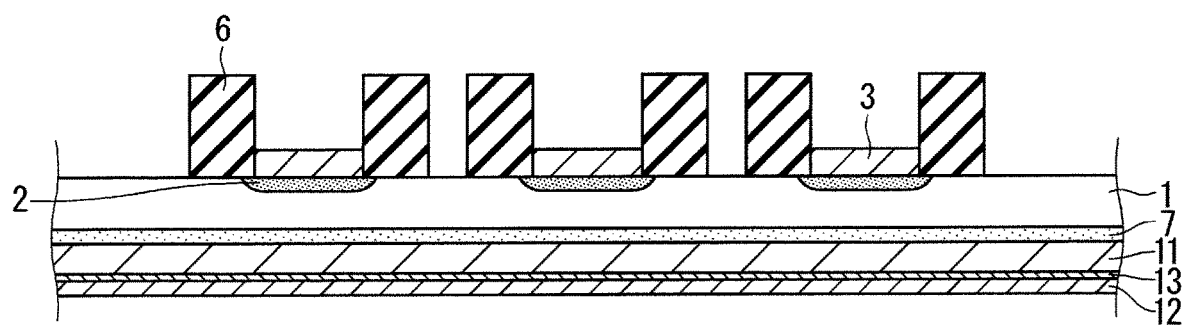
FIG. 16 is a cross-sectional view illustrating the process of manufacturing the semiconductor device according to the second embodiment.

As illustrated in FIG. 16, at step S18, the temperature of the wafer stage in the deposition chamber is set to be equal to or lower than room temperature, for example, 25° C., and the deposition of the back-surface Au film is continued to complete the back-surface Au film 12. Au diffusion from the back-surface Au film to the back-surface reactant layer 13 during deposition of the back-surface Au film can be reduced by performing the deposition with the wafer stage at 25° C. or lower.

Subsequently at step S19, cleaning treatment by plasma, in other words, plasma cleaning is performed on the surface of the back-surface Au film 12. In the second embodiment, the plasma cleaning involves cleaning by oxygen plasma and then cleaning by hydrogen plasma. This enhances adhesion between the back-surface Au film 12 and the back-surface electroless Ni plating film 14, which is formed through the next process.

Subsequently at step S20, as illustrated in FIG. 17, the back-surface electroless Ni plating film 14 is formed on the back-surface Au film 12. First, the semiconductor wafer 1 is immersed in a degreasing solution to remove grease and organic substance on the surface of the back-surface Au film 12, thereby improving wettability of the back-surface Au film 12. Subsequently, the semiconductor wafer 1 is immersed in an electroless Ni plating solution to form, through autocatalytic reaction that deposits nickel, the back-surface electroless Ni plating film 14 having a desired thickness on the back-surface Au film 12. The deposition of electroless Ni plate through the autocatalytic reaction occurs because Au of the back-surface Au film 12 serves as the catalyst point of electroless Ni plate deposition. However, only the front-surface Al alloy film 3, which is not the electroless Ni plate catalyst point, is exposed on the front surface side of the semiconductor wafer 1, and thus no electroless Ni plate deposition occurs on the front surface side of the semiconductor wafer 1. The thickness of the back-surface electroless Ni plating film 14 is preferably, for example, 2 to 10 μm, and more preferably, for example, 5 μm, with a film stress on the semiconductor wafer 1 and the like taken into account.

Subsequently at step S21, the semiconductor wafer 1 after the formation of the back-surface electroless Ni plating film 14 is immersed in an electroless Au plating solution to reduce oxidation of the surface of the back-surface electroless Ni plating film 14. Accordingly, the back-surface electroless Au plating film 15 having a thickness of, for example, 10 to 70 nm is formed on the back-surface electroless Ni plating film 14. In this example, the formation of the back-surface electroless Au plating film 15 is achieved by using the nickel autocatalytic reaction, but the present invention is not limited thereto. For example, the zincate treatment may be used.

FIG. 18 is a diagram illustrating exemplary conditions of the above-described processes. It was observed that, when a semiconductor device was formed under the conditions illustrated in FIG. 18, the back-surface reactant layer 13 having a thickness of 48 nm was disposed between the back-surface Al alloy film 11 and the back-surface Au film 12. Moreover, no loss occurred to the back-surface Al alloy film 11, and sufficient sticking force was maintained between the back-surface Al alloy film 11 and the back-surface electroless Ni plating film 14.

<Gist of Second Embodiment>

The semiconductor device according to the second embodiment as described above includes the back-surface reactant layer 13 disposed between the back-surface Al alloy film 11 and the back-surface Au film 12. With this configuration, the back-surface reactant layer 13 functions as a barrier film to reduce contamination of the semiconductor wafer 1 by the degreasing solution, the electroless Ni plating solution, and the electroless Au plating solution at plating treatment. In addition, loss of the back-surface Al alloy film 11 due to the degreasing solution is reduced, which leads to formation of the back-surface electroless Ni plating film 14 having a uniform film thickness. Other effects same as those described in the first embodiment can be also obtained.

Third Embodiment

FIG. 19 is a cross-sectional view illustrating a configuration of a semiconductor device according to a third embodiment of the present invention. Hereinafter, among components described in the third embodiment, a component same as or similar to those in Embodiments 1 and 2 is denoted by the same reference sign, and any different component will be mainly described.

The semiconductor device illustrated in FIG. 19 includes the semiconductor wafer 1, the front-surface semiconductor element region 2, the front-surface Al alloy film 3, the front-surface Au film 4, the front-surface reactant layer 5, the polyimide protective film 6, the back-surface diffusion region 7, the front-surface electroless Ni plating film 9, the front-surface electroless Au plating film 10, the back-surface Al alloy film 11, the back-surface Au film 12, the back-surface reactant layer 13, the back-surface electroless Ni plating film 14, and the back-surface electroless Au plating film 15.

In the third embodiment, the components disposed on the front surface side of the semiconductor wafer 1 illustrated in FIG. 1 in the first embodiment are provided on the front surface side of the semiconductor wafer 1, and the components disposed on the back surface side of the semiconductor wafer 1 illustrated in FIG. 11 in the second embodiment are provided on the back surface side of the semiconductor wafer 1. In addition, the semiconductor wafer 1 in the third embodiment includes a reinforcement part 1a disposed at an outer peripheral part of the semiconductor wafer 1. In the following description, the reinforcement part 1a is a relatively thick part of the semiconductor wafer 1, but is not limited thereto.

<Manufacturing Method>

Figure 20:
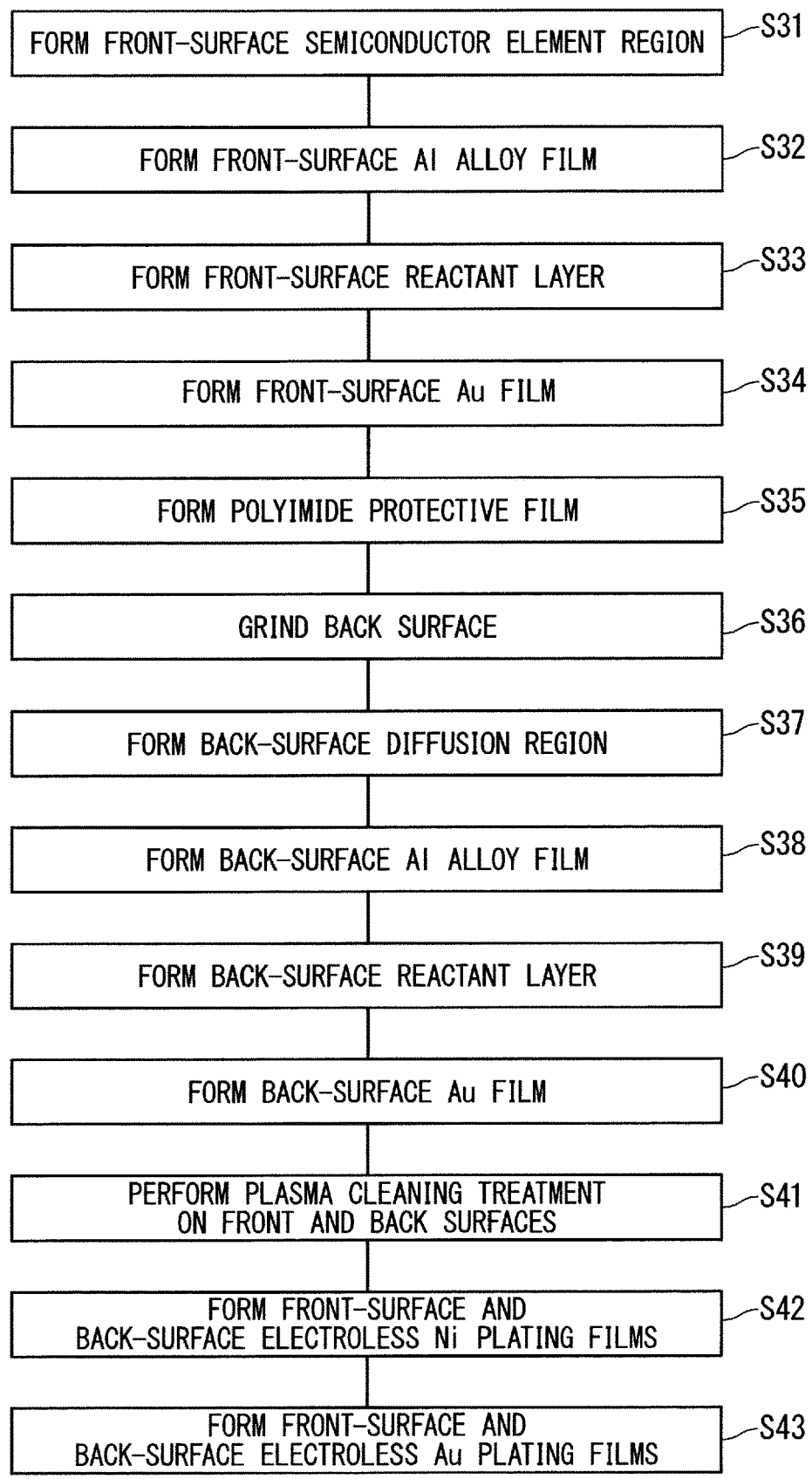
FIG. 20 is a flowchart illustrating a process of manufacturing the semiconductor device according to the third embodiment.

FIG. 20 is a flowchart illustrating a process of manufacturing the semiconductor device according to the third embodiment.

At steps S31 to S35, processes same as those at steps S1 to S5 in the first embodiment are performed. Accordingly, a structure same as that in FIG. 6 is obtained.

Figure 21:
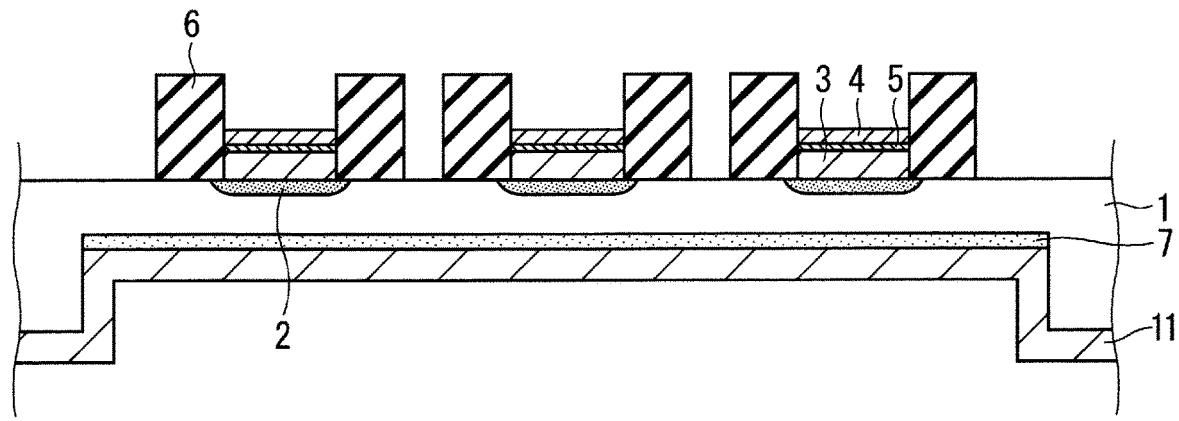
FIG. 21 is a cross-sectional view illustrating the process of manufacturing the semiconductor device according to the third embodiment.

Subsequently at step S36, as illustrated in FIG. 21, parts other than the outer peripheral part of the semiconductor wafer 1 are thinned by mechanically grinding the back surface of the semiconductor wafer 1. Thereafter, wet etching is performed to remove, by 5 to 20 μm, a defect layer (not illustrated) generated on the semiconductor wafer 1 through the mechanical grinding, thereby thinning the part to a desired thickness. Accordingly, the relatively thick reinforcement part 1a is formed at the outer peripheral part of the semiconductor wafer 1. The reinforcement part 1a can maintain the strength of the semiconductor wafer 1 and reduce warping of the semiconductor wafer 1 when a part other than the outer peripheral part of the semiconductor wafer 1 is thinned.

Subsequently at step S37, the back-surface diffusion region 7 is formed on the back surface of the semiconductor wafer 1, and then at step S38, the back-surface Al alloy film 11 containing, for example, AlSi, AlCu, or AlSiCu is formed on the back surface of the semiconductor wafer 1 by sputtering.

Figure 22:
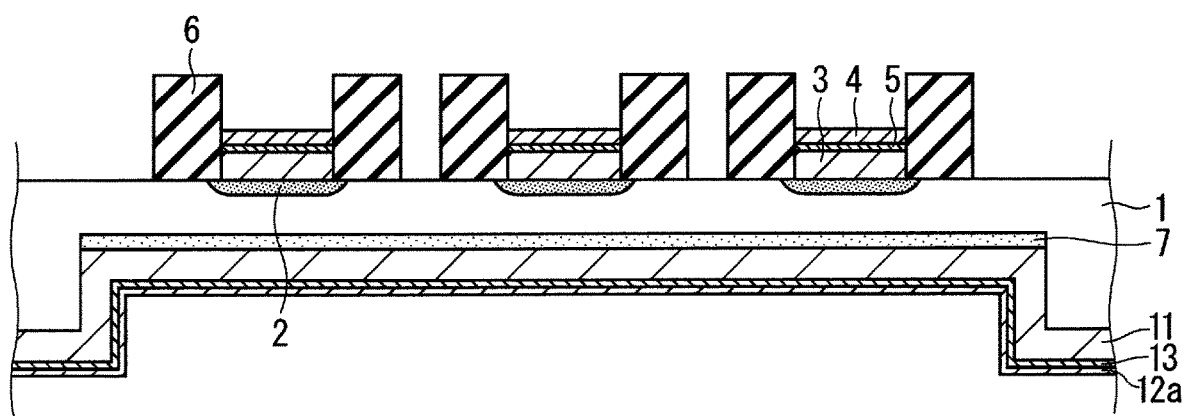
FIG. 22 is a cross-sectional view illustrating the process of manufacturing the semiconductor device according to the third embodiment.

Subsequently at step S39, as illustrated in FIG. 22, the back-surface Au film 12a is formed on the surface of the back-surface Al alloy film 11 by sputtering. In this process, the wafer stage in the deposition chamber is heated to deposit the back-surface Au film 12a. When the back-surface Au film 12a is deposited by heating in this manner, Au of the back-surface Au film 12a diffuses in a part of the back-surface Al alloy film 11 in contact with the back-surface Au film 12a. As a result, the back-surface reactant layer 13 containing Au is formed between the back-surface Al alloy film 11 and the back-surface Au film 12a.

Figure 23:
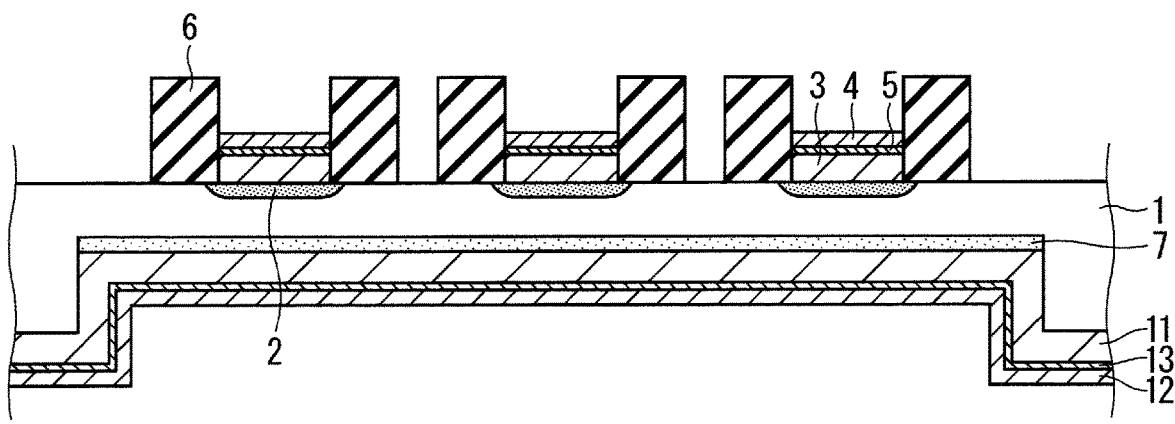
FIG. 23 is a cross-sectional view illustrating the process of manufacturing the semiconductor device according to the third embodiment.

As illustrated in FIG. 23, at step S40, the temperature of the wafer stage in the deposition chamber is set to be equal to or lower than room temperature, for example, 25° C., and the deposition of the back-surface Au film is continued to complete the back-surface Au film 12. Au diffusion from the back-surface Au film to the back-surface reactant layer 13 during deposition of the back-surface Au film can be reduced by performing the deposition with the wafer stage at 25° C. or lower.

Subsequently at step S41, cleaning treatment by plasma, in other words, plasma cleaning is performed on the surface of the front-surface Au film 4 and the surface of the back-surface Au film 12. In the third embodiment, the plasma cleaning involves cleaning by oxygen plasma and then cleaning by hydrogen plasma. This enhances adhesion between the front-surface Au film 4 and the front-surface electroless Ni plating film 9, which is formed through the next process, and adhesion between the back-surface Au film 12 and the back-surface electroless Ni plating film 14.

Subsequently at step S42, as illustrated in FIG. 24, the front-surface electroless Ni plating film 9 and the back-surface electroless Ni plating film 14 are formed in parallel on the front-surface Au film 4 and the back-surface Au film 12, respectively. First, the semiconductor wafer 1 is immersed in a degreasing solution to remove grease and organic substance on the surface of the front-surface Au film 4 and the surface of the back-surface Au film 12, thereby improving wettability of the front-surface Au film 4 and the back-surface Au film 12. Subsequently, the semiconductor wafer 1 is immersed in an electroless Ni plating solution to form, through autocatalytic reaction that deposits nickel, the front-surface electroless Ni plating film 9 and the back-surface electroless Ni plating film 14 having desired thicknesses. The deposition of electroless Ni plate through the autocatalytic reaction occurs because Au serves as the catalyst point of electroless Ni plate deposition. The thicknesses of the front-surface electroless Ni plating film 9 and the back-surface electroless Ni plating film 14 are preferably, for example, 2 to 10 µm, with a film stress on the semiconductor wafer 1 and the like taken into account.

Subsequently at step S43, the front-surface electroless Au plating film 10 and the back-surface electroless Au plating film 15 are formed in parallel on the front-surface electroless Ni plating film 9 and the back-surface electroless Ni plating film 14, respectively. The formation of the electroless Au plating film may be achieved by using the nickel autocatalytic reaction or the zincate treatment.

FIG. 25 is a diagram illustrating exemplary conditions of the above-described processes. It was observed that, when a semiconductor device was formed under the conditions illustrated in FIG. 25, the front-surface reactant layer 5 had a thickness of 59 nm and the back-surface reactant layer 13 had a thickness of 43 nm. Moreover, no loss occurred to the front-surface Al alloy film 3 and the back-surface Al alloy film 11, and sufficient sticking force was maintained between the front-surface Al alloy film 3 and the front-surface electroless Ni plating film 9 and between the back-surface Al alloy film 11 and the back-surface electroless Ni plating film 14. It was also observed that warping of the semiconductor wafer 1 was reduced.

<Gist of Third Embodiment>

The semiconductor device according to the third embodiment as described above includes the front-surface reactant layer 5 and the back-surface reactant layer 13, and thus effects same as those of Embodiments 1 and 2 can be obtained.

In the third embodiment, the semiconductor wafer 1 includes the reinforcement part 1a disposed at the outer peripheral part of the semiconductor wafer 1. This configuration reduces warping due to a stress by the Ni plating film, which occurs to the semiconductor wafer 1 or a chip when the semiconductor wafer 1 is formed into the chip.

The present invention allows optional combination of the preferred embodiments and appropriate modification or omission of each preferred embodiment within the scope of the invention.

Although the present invention is described above in detail, the above description is merely exemplary in any aspect and does not limit the present invention. Numerous modifications not exemplarily described above would be thought of without departing from the scope of the present invention.

EXPLANATION OF REFERENCE SIGNS

1: semiconductor wafer
3: front-surface Al alloy film
4: front-surface Au film
5: front-surface reactant layer
9: front-surface electroless Ni plating film
10: front-surface electroless Au plating film
11: back-surface Al alloy film
12: back-surface Au film
13: back-surface reactant layer
14: back-surface electroless Ni plating film
15: back-surface electroless Au plating film

The invention claimed is:

1. A semiconductor device comprising:
   a semiconductor substrate;
   an aluminum alloy film disposed above at least one of a front surface and a back surface of the semiconductor substrate;
   a catalyst metal film disposed above the aluminum alloy film and exhibiting catalytic activity for autocatalytic reaction that deposits nickel;
   an electroless nickel plating film disposed on the catalyst metal film; and
   a reactant layer disposed between the aluminum alloy film and the catalyst metal film and containing metal of the catalyst metal film.

2. The semiconductor device according to claim 1, further comprising an electroless gold plating film disposed on the electroless nickel plating film.

3. The semiconductor device according to claim 1, wherein the metal of the catalyst metal film contains at least one of Au, Pd, Ni, and Co.

4. The semiconductor device according to claim 1, wherein the catalyst metal film has a thickness of 20 nm to 200 nm inclusive.

5. The semiconductor device according to claim 1, wherein the semiconductor substrate includes a reinforcement part disposed at an outer peripheral part of the semiconductor substrate.

6. A method for manufacturing a semiconductor device, the method comprising:
   a step (a) of forming an aluminum alloy film on at least one of a front surface and a back surface of a semiconductor substrate;
   a step (b) of forming, on the aluminum alloy film, a catalyst metal film exhibiting catalytic activity for autocatalytic reaction that deposits nickel;
   a step (c) of forming a reactant layer between the aluminum alloy film and the catalyst metal film by diffusing metal of the catalyst metal film in a part of the aluminum alloy film in contact with the catalyst metal film; and
   a step (d) of forming an electroless nickel plating film on the catalyst metal film through the autocatalytic reaction after the step (c).

7. The method for manufacturing a semiconductor device according to claim 6, further comprising a step (e) of forming an electroless gold plating film on the electroless nickel plating film.

8. The method for manufacturing a semiconductor device according to claim 6, wherein the metal of the catalyst metal film contains at least one of Au, Pd, Ni, and Co.

9. The method for manufacturing a semiconductor device according to claim 6, wherein the catalyst metal film has a thickness of 20 nm to 200 nm inclusive.

10. The method for manufacturing a semiconductor device according to claim 6, further comprising a step (f) of cleaning the catalyst metal film with plasma between the step (c) and the step (d).

11. The method for manufacturing a semiconductor device according to claim 10, wherein the plasma includes oxygen plasma or hydrogen plasma.

12. The method for manufacturing a semiconductor device according to claim 6, further comprising a step (g) of forming a reinforcement part at an outer peripheral part of the semiconductor substrate.

* * * * *